United States Patent [19]

Deguchi

[11] Patent Number: 4,912,728
[45] Date of Patent: Mar. 27, 1990

[54] ANALOG-TO-DIGITAL CONVERTER FOR STEPPED SQUARE QAM DEMODULATORS

[75] Inventor: Takumi Deguchi, Tokyo, Japan

[73] Assignee: NEC Corporation, Japan

[21] Appl. No.: 256,701

[22] Filed: Oct. 12, 1988

[30] Foreign Application Priority Data

Oct. 14, 1987 [JP] Japan ................. 62-259284

[51] Int. Cl.$^4$ ............................................ H04L 23/02
[52] U.S. Cl. ....................................... 375/39; 329/304
[58] Field of Search ..................... 375/39, 41, 102, 17; 139/104

[56] References Cited

U.S. PATENT DOCUMENTS 4,554,671 11/1985 Collins .................................. 375/30
4,571,550 2/1986 Head .................................... 375/120

Primary Examiner—Robert L. Griffin
Assistant Examiner—T. Salindong
Attorney, Agent, or Firm—Laff, Whitesel, Conte & Saret

[57] ABSTRACT

An analog-to-digital converter for use with a stepped square $2^{2n}$-QAM demodulator comprises a first group of $(2^{n+1}-1)$ comparators for detecting signal points of a demodulated signal of a stepped square QAM system which are located within a $2^n \times 2^n$ square of the signal constellation of the stepped square QAM system, and a second group of four comparators for detecting signal points located outside of the square. A first logic circuit is provided to convert the outputs of the comparators of the first group to a first multibit digital signal representative of the signal points located within the square, and a second logic circuit is provided for converting the outputs of the comparators of the second group to a second multibit digital signal representative of the signal points located outside of the square.

4 Claims, 4 Drawing Sheets

ANALOG-TO-DIGITAL CONVERTER FOR STEPPED SQUARE QAM DEMODULATORS

BACKGROUND OF THE INVENTION

The present invention relates generally to stepped square quadrature amplitude modulation (SS-QAM) system demodulators, and more specifically to an analog-to-digital converter for use with SS $2^{2n}$-QAM demodulators.

U.S. Pat. No. 4,675,619 describes a stepped square $2^{2n}$-QAM demodulator which comprises an (n+2)-bit analog-to-digital converter for each of the I- and Q-channel systems to convert the ($2^n$+2) levels of the demodulated analog signal to a corresponding digital signal containing error indicating least significant bits. For example, the SS-256-QAM system has a signal constellation of stepped square configuration with 18 rows extending along the Q-channel axis and 18 columns extending along the I-channel axis. Each of the rows must be discriminated by comparison with 35 dicision thresholds of the Q-channel system and each of the columns must also be discriminated by comparison with 35 decision thresholds of the I-channel system. Because of the need to generate error signals for feedback control, the analog-to-digital converter of 6 bits or more would be required. To implement such an analog-to-digital converter, $2^6$ comparators are required, i.e., the (n+2)-bit analog-to-digital converter requires as many as $2^{n+2}$ comparators. One approach to this problem would be to compress the amplitude of the demodulated signal. However, discrimination error will increase due to a possible reduction of signal to noise ratio. Another approach is to employ a 6-bit analog-to-digital converter having 63 or more decision threshold levels and a high speed read-only memory connected to the output of the 6-bit A/D converter. The read-only memory has data stored in locations which are addressable as a function of the input from the A/D converter, the retrieved data indicating signal points located inside or outside of a square of the signal constellation of a SS-256 QAM system. However, a large chip size will result if the A/D converter is implemented by LSI technology and a substantial amount of power is dissipated.

SUMMARY OF THE INVENTION

It is therefore an object of the present invention to provide an analog-to-digital converter for a stepped square $2^{2n}$-QAM demodulator having a smaller number of comparators.

Specifically, the analog-to-digital converter of the present invention for a stepped square $2^{2n}$-QAM demodulator, (where n is equal to or greater than 3) comprises a first group of ($2^{n+1}$−1) comparators for detecting signal points of a demodulated signal of a stepped square QAM system which are located within a $2^n \times 2^n$ square of the signal constellation of the stepped square QAM system, and a second group of four comparators for detecting signal points located outside of the square. A first logic circuit is provided to convert the outputs of the comparators of the first group to a first multibit digital signal representative of the signal points located within the square, and a second logic circuit is provided for converting the outputs of the comparators of the second group to a second multibit digital signal representative of the signal points located outside of the square.

Another object of the invention is to provide a stepped square $2^{2n}$-QAM demodulator including I-channel and Q-channel systems. Each of the I- and Q-channel systems comprises a level control circuit for controlling the level of a demodulated signal of the QAM system in response to a control signal applied thereto, and an analog-to-digital converter. The A/D converter comprises a first group of ($2^{n+1}$−1) comparators for detecting signal points of the demodulated signal which are located within a $2^n \times 2^n$ square of the signal constellation of the stepped square QAM system, a second group of four comparators for detecting signal points located outside of the square, first logic circuit means for converting the outputs of the comparators of the first group to a first multibit digital signal representative of the signal points located within the square, and second logic circuit means for converting the outputs of the comparators of the second group to a second multibit digital signal representative of the signal points located outside of the square. The least significant bit of the first multibit digital signal represents an error component of the remainder of the first multibit digital signal and the least significant bit of the second multibit digital signal represents an error component of the remainder of the second multibit digital signal. The control signal is derived from the first and second multibit digital signals, and an n-bit digital output signal is derived from the remainders of the first and second multibit digital signals.

BRIEF DESCRIPTION OF THE DRAWINGS

The present invention will be described in further detail with reference to the accompanying drawings, in which.

DETAILED DESCRIPTION

Figure 1:
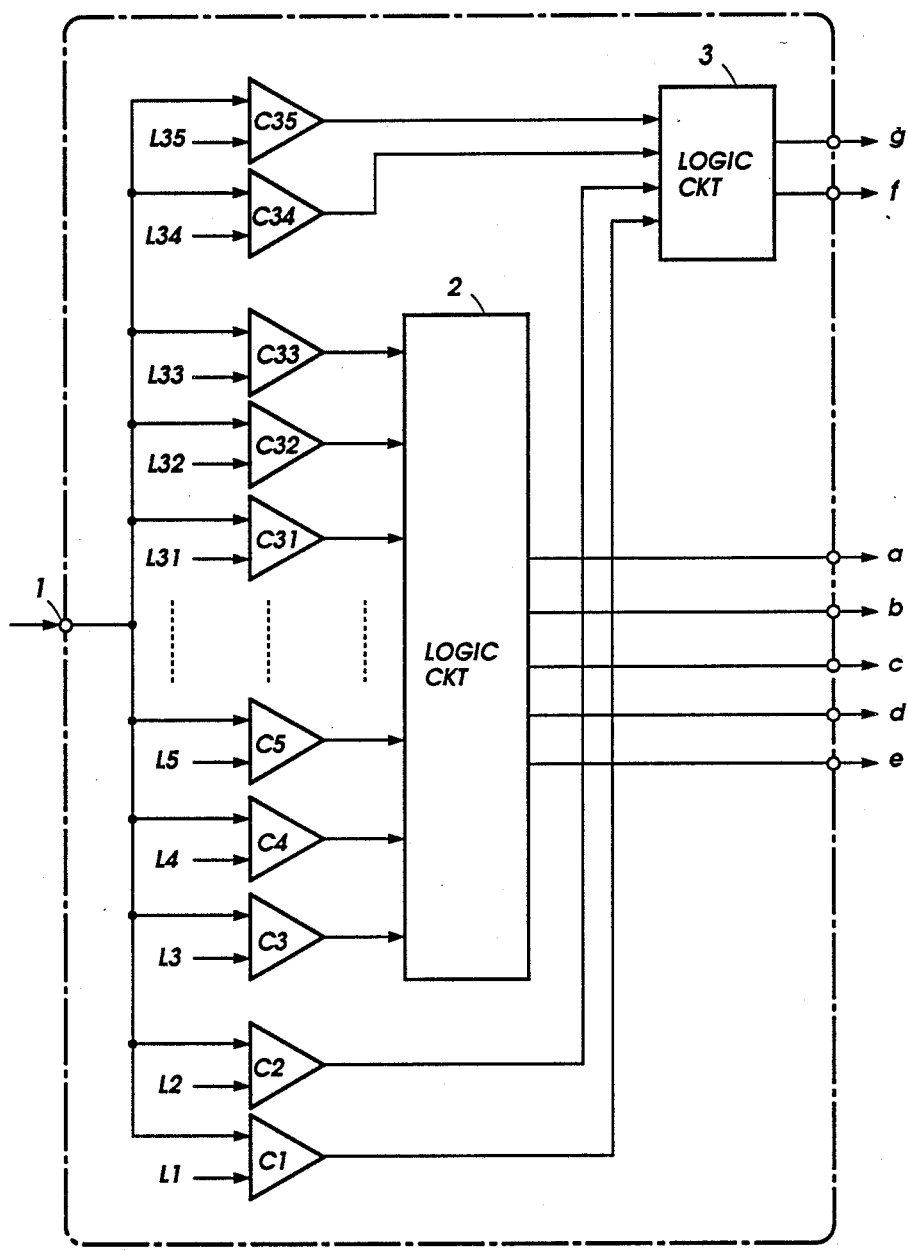
FIG. 1 is a block diagram of an analog-to-digital converter of the present invention.
Figure 2:
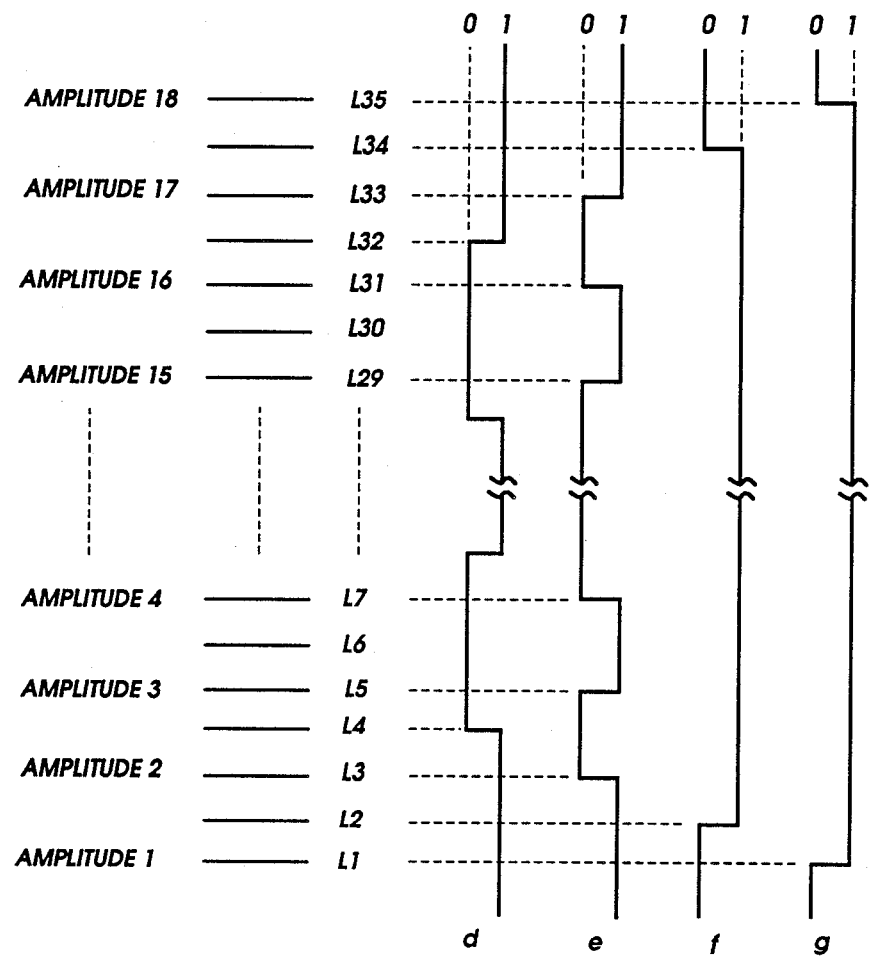
FIG. 2 is a waveform diagram illustrating the relationships between the amplitudes of a demodulated signal and digital outputs of the analog-to-digital converter of FIG. 1.
Figure 3:
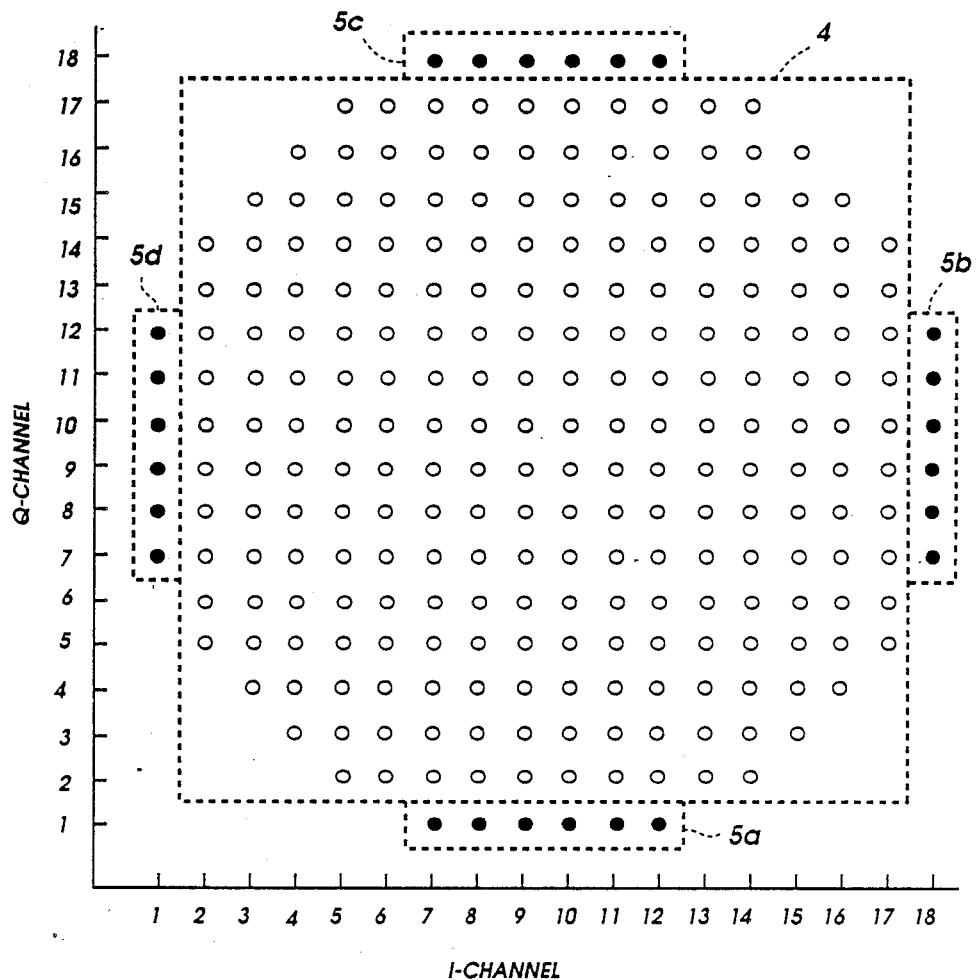
FIG. 3 is an illustration of the signal constellation of a stepped square 256-QAM system.

Referring now to FIG. 1, there is shown an analog-to-digital converter according to a preferred embodiment of the present invention. The A/D converter comprises an array of ($2^{n+1}$+3) comparators C1 through C35 (where n is 4 in the case of the stepped square 256-QAM system) respectively having decision threshold levels L1 through L35 to compare the instantaneous level of an incoming I- or Q-channel demodulated signal of the QAM system applied to an input terminal 1 with their decision threshold levels. Each of the comparators C1 to C35 produces a logic-1 or logic-0 output depending on whether the input level is higher or lower than the decision thresholds of the comparators. It is seen in FIG. 2 that the odd-numbered decision threshold levels L1, L3 ... L33, L35 correspond respectively to the eighteen levels, or signal points of the I- or Q-channel signal of the SS 256-QAM system. The functions of four comparators C1, C2, C34, C35 are to detect signal points outside of a 16×16 square indicated at 4 in the signal constellation of the SS 256-QAM system as shown in FIG. 3, and the functions of ($2^{n+1}$−1)

comparators C3 to C33 are to detect signal points within the square 4. Specifically, if the input of the A/D converter is the I-channel signal, comparators C1 and C2 detect signal points on the leftmost column shown at 5d in the signal constellation which is located outside of the square 4, and comparators C34 and C35 detect signal points in the rightmost column 5b of the signal constellation which is also outside of square 4. The comparators C3 to C33 detect signal points of the 2nd to 17-th columns of the square 4. Likewise, if the input signal is the Q-channel of the 256 SS-QAM system, the comparators C1 and C2 detect signal points of the lowermost row 5a of the signal constellation and comparators C34 and C35 detect signal points of the uppermost row 5c, and comparators C3 to C33 detect signal points of the 2nd to 17-th rows within the square 4.

The logic outputs of the comparators C3 to C33 are connected to respective inputs of a first logic circuit 2 to generate a 5-bit digital signal, or $2^{n+1}$-bit outputs on parallel output lines a, b, c, d, and e, with the output line a being the most significant bit (MSB) and the output line e being the least significant bit (LSB). The rectangular waveforms of the LSB and 4SB of the 5-bit digital signal are shown in FIG. 2. On the other hand, the logic outputs of comparators C1, C2, C34 and C35 are connected to a second logic circuit 3 to produce 2-bit outputs which appear respectively on output lines f and g. The rectangular waveforms of the 2-bit outputs are shown in FIG. 2 in relation to the threshold levels L1, L2, L34 and L35. More specifically, the output line f is at logic-1 for an input level lying between thresholds L2 and L34 and the output line g is at logic-1 for an input level lying between thresholds L1 and L35.

It is seen therefore that the analog-to-digital converter for a stepped square $2^{2n}$-QAM system needs ($2^{n+1}-1$) comparators for detecting signal points inside of the outermost region of the signal constellation and four comparators for detecting the outermost signal points. The number of comparators employed in the present invention is therefore smaller than the conventional A/D converter having $2^{n+2}$ comparators by $2^{n+2}-(2^{n+1}+3)$. The reduction of comparators results in a reduction of power consumption and a reduction of chip size if it is implemented with LSI technology. A further advantage of the present invention is that it eliminates the need for a high speed read-only memory for detecting the outermost signal points to generate an error signal for feedback control.

Figure 4:
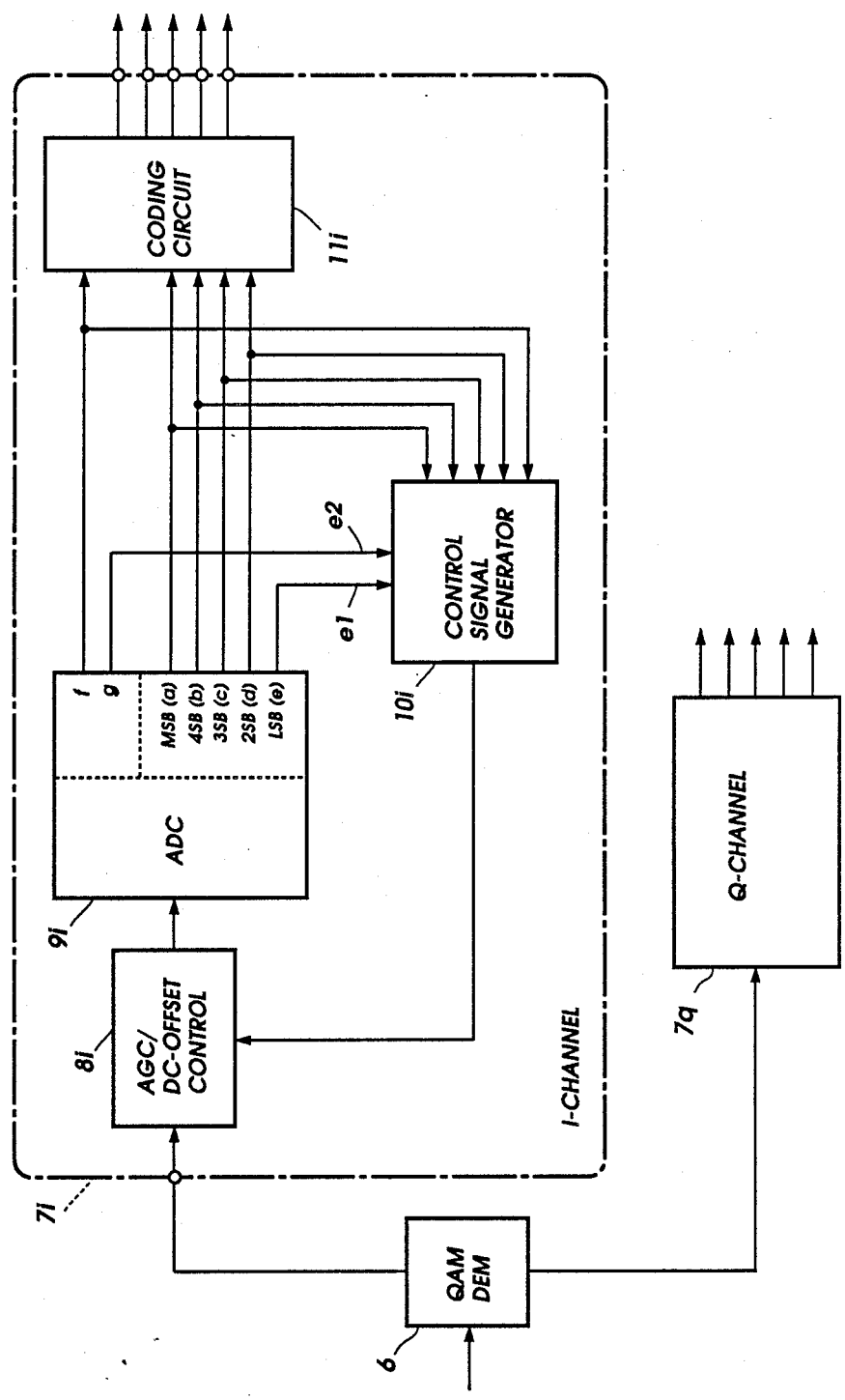
FIG. 4 is a block diagram of a stepped square 256-QAM demodulator incorporating the A/D converter of FIG. 1.

The analog-to-digital converter of the invention is incorporated in a stepped square QAM demodulator as shown in FIG. 4. The demodulator comprises a synchronous detection QAM demodulator circuit 6 which performs quadrature demodulation on an incoming 256-SS-QAM signal and produces I-channel and Q-channel demodulated signals and feeds I-channel and Q-channel systems 7i and 7q of identical construction. For simplicity, only the I-channel system is shown in detail. The I-channel demodulated signal is supplied to an automatic gain controller and/or dc-offset controller 8i. The output of controller 8i is coupled to the input of an A/D converter 9i constructed according to the present invention as described above. The LSB output on line e of the A/D converter 9i is supplied as an error signal $e_1$ to a control signal generator 10i as a representation of the deviation of the MSB to 2SB outputs on lines a to d from an optimum value and the signal on output line g is supplied as an error signal $e_2$ to the control signal generator 10i as a representation of the deviation of the signal on output line f from optimum value. The MSB to 2SB outputs on lines a to d and the signal on output line f are supplied to the control signal generator 10i as well as to a coding circuit 11i which converts the inputs to a five-bit I-channel digital output. Control signal generator 10i counts the error signals and controls the controller 8i so that the level of the I-channel signal at the input of the A/D converter 9i is adjusted to correspond to a desired decision threshold.

While mention has been made of a SS 256-QAM system, the A/D converter of the present invention could equally be applied to a SS-QAM system where n is equal to or greater than 3. The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. An analog-to-digital converter for a stepped square $2^{2n}$-QAM (quadrature amplitude modulation) demodulator, where n is equal to or greater than 3, comprising:
   a first group of ($2^{n+1}-1$) comparators for detecting signal points of a demodulated signal of a stepped square QAM system which are located within a $2^n \times 2^n$ square of the signal constellation of said stepped square QAM system;
   a second group of four comparators for detecting signal points located outside of said square;
   first logic circuit means for converting the outputs of the comparators of said first group to a first multibit digital signal representative of the signal points located within said square; and
   second logic circuit means for converting the outputs of the comparators of said second group to a second multibit digital signal representative of the signal points located outside of said square.

2. An analog-to-digital converter as claimed in claim 1, wherein the least significant bit of said first multibit digital signal represents an error component of the remainder of said first multibit digital signal and one bit of said second multibit digital signal represents an error component of the remainder of said second multibit digital signal.

3. An analog-to-digital converter as claimed in claim 1, wherein said first group of ($2^{n+1}-1$) comparators compare said demodulated signal with ($2^{n+1}-1$) successively different decision thresholds of intermediate values and generate logic outputs representative of signal points located within said $2^n \times 2^n$ square, and said second group of four comparators compare said demodulated signal with successively different decision thresholds higher than said intermediate values and with successively different decision thresholds lower than said intermediate values and generate logic outputs representative of signal points located outside of said square.

4. A stepped square $2^{2n}$-QAM (quadrature amplitude modulation) demodulator (where n is equal to or greater than 3) including I-channel and Q-channel systems, each of said I- and Q-channel systems comprising:
   level control means for controlling the level of a demodulated signal of said QAM system in response to a control signal applied thereto;
   an analog-to-digital converter comprising a first group of ($2^{n+1}-1$) comparators for detecting signal points of said demodulated signal which are located within a $2^n \times 2^n$ square of the signal constellation of said stepped square QAM system, a second group of four comparators for detecting signal points located outside of said square, first logic circuit means for converting the outputs of the comparators of said first group to a first multibit digital signal representative of the signal points located within said square, and second logic circuit means for converting the outputs of the comparators of said second group to a second multibit digital signal representative of the signal points located outside of said square, the least significant bit of said first multibit digital signal representing an error component of the remainder of said first multibit digital signal and one bit of said second multibit digital signal representing an error component of the remainder of said second multibit digital signal;

means for deriving said control signal from said first and second multibit digital signals; and means for deriving an n-bit digital signal from said remainders of said first and second multibit digital signals.

* * * * *